(12) United States Patent
Zhu et al.

(10) Patent No.: US 7,728,364 B2
(45) Date of Patent: Jun. 1, 2010

(54) ENHANCED MOBILITY CMOS TRANSISTORS WITH A V-SHAPED CHANNEL WITH SELF-ALIGNMENT TO SHALLOW TRENCH ISOLATION

(75) Inventors: Huilong Zhu, Poughkeepsie, NY (US); Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 578 days.

(21) Appl. No.: 11/624,931

(22) Filed: Jan. 19, 2007

(65) Prior Publication Data
US 2008/0173906 A1 Jul. 24, 2008

(51) Int. Cl.
*H01L 39/06* (2006.01)
(52) U.S. Cl. .............. 257/255; 257/141; 257/E29.004
(58) Field of Classification Search ............ 257/64, 257/210, 66, 255, 288
See application file for complete search history.

(56) References Cited

U.S. PATENT DOCUMENTS

| 6,864,520 B2 * | 3/2005 | Fischetti et al. ............. 257/255 |
| 7,060,585 B1 | 6/2006 | Cohen et al. |
| 7,102,166 B1 | 9/2006 | Bryant et al. |
| 2006/0118918 A1 | 6/2006 | Waite et al. |
| 2006/0194421 A1 | 8/2006 | Ieong et al. |

OTHER PUBLICATIONS

O. Weber et al., "A Novel Locally Engineered (111) V-Channel pMOSFET Architecture with Improved Drivability Characteristics for Low-Standby Power (LSTP) CMOS Applications", 2005 Symposium on VLSI Technology Digest of Technical Papers, pp. 156-157.

Leland Chang et al., "CMOS Circuit Performance Enhancement by Surface Orientation Optimization", IEEE Transactions on Electron Devices, vol. 51, No. 10, Oct. 2004, pp. 1621-1627.

* cited by examiner

*Primary Examiner*—Jerome Jackson, Jr.
*Assistant Examiner*—Dale Page
(74) *Attorney, Agent, or Firm*—Scully, Scott, Murphy & Presser, P.C.; Joseph P. Abate, Esq.

(57) ABSTRACT

The present invention provides structures and methods for a transistor formed on a V-shaped groove. The V-shaped groove contains two crystallographic facets joined by a ridge. The facets have different crystallographic orientations than what a semiconductor substrate normally provides such as the substrate orientation or orientations orthogonal to the substrate orientation. Unlike the prior art, the V-shaped groove is formed self-aligned to the shallow trench isolation, eliminating the need to precisely align the V-shaped grooves with lithographic means. The electrical properties of the new facets, specifically, the enhanced carrier mobility, are utilized to enhance the performance of transistors. In a transistor with a channel on the facets that are joined to form a V-shaped profile, the current flows in the direction of the ridge joining the facets avoiding any inflection in the direction of the current.

11 Claims, 12 Drawing Sheets

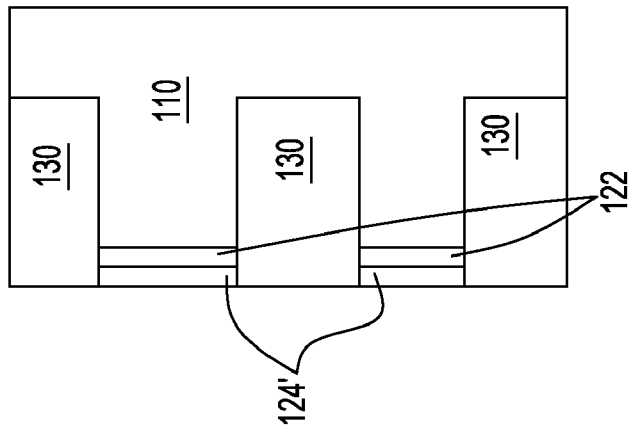
FIG. 4C
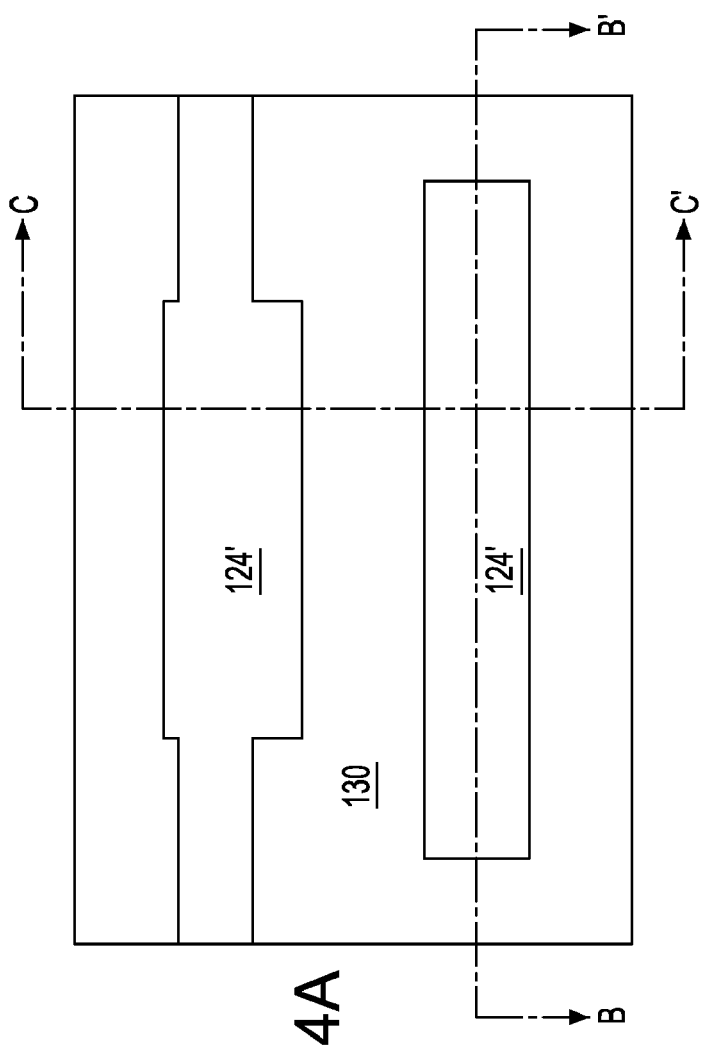
FIG. 4A
FIG. 4B

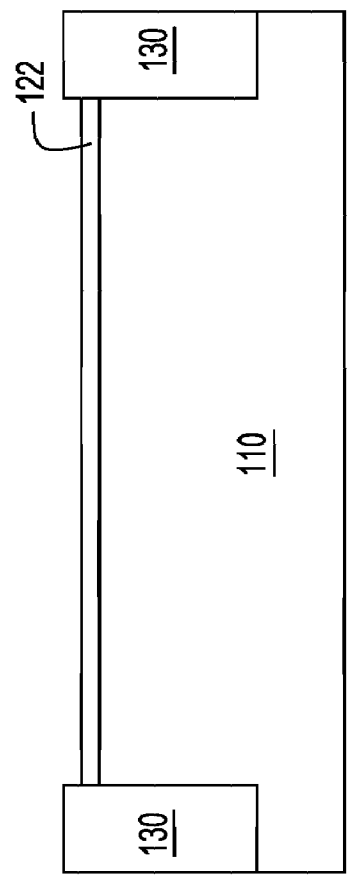
FIG. 5C
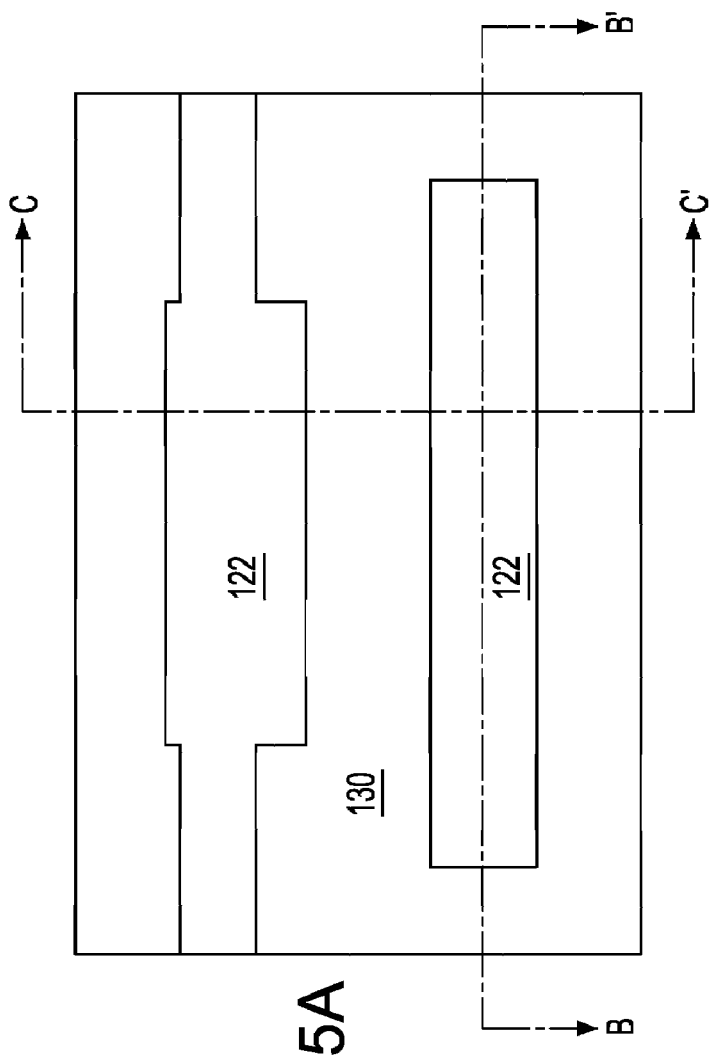
FIG. 5A
FIG. 5B

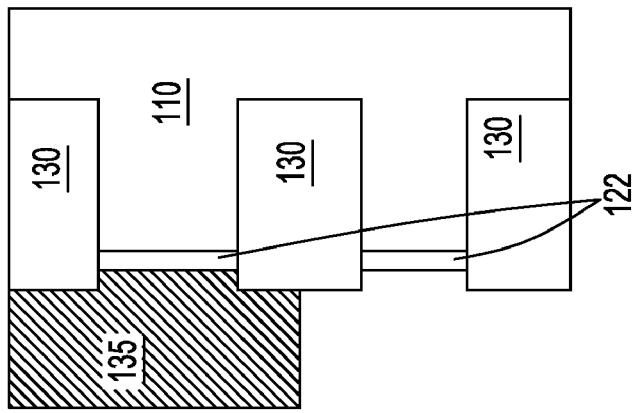
FIG. 6C
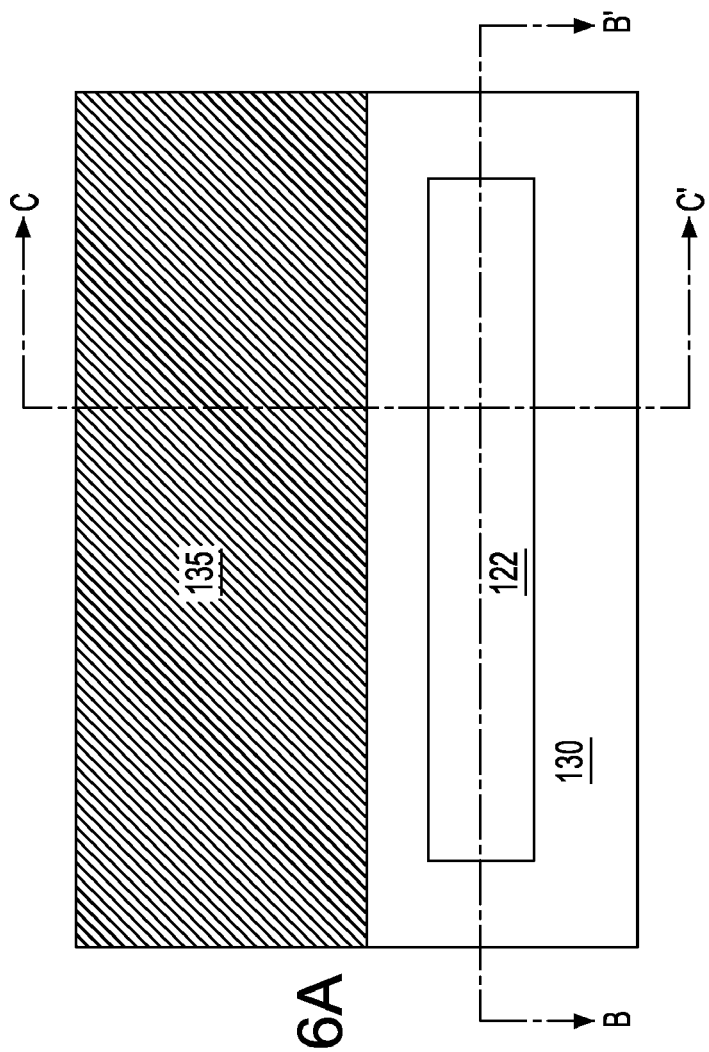
FIG. 6A
FIG. 6B

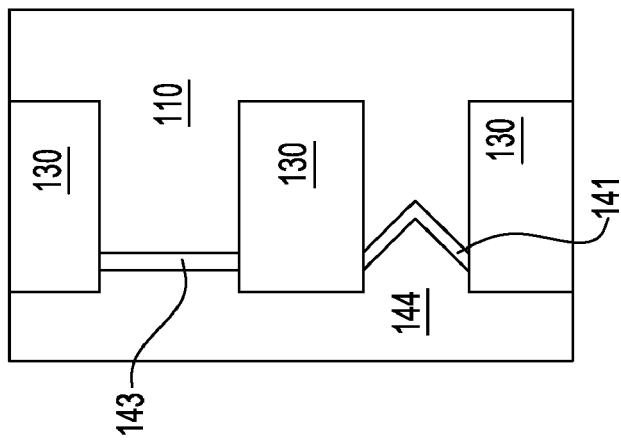
FIG. 8C
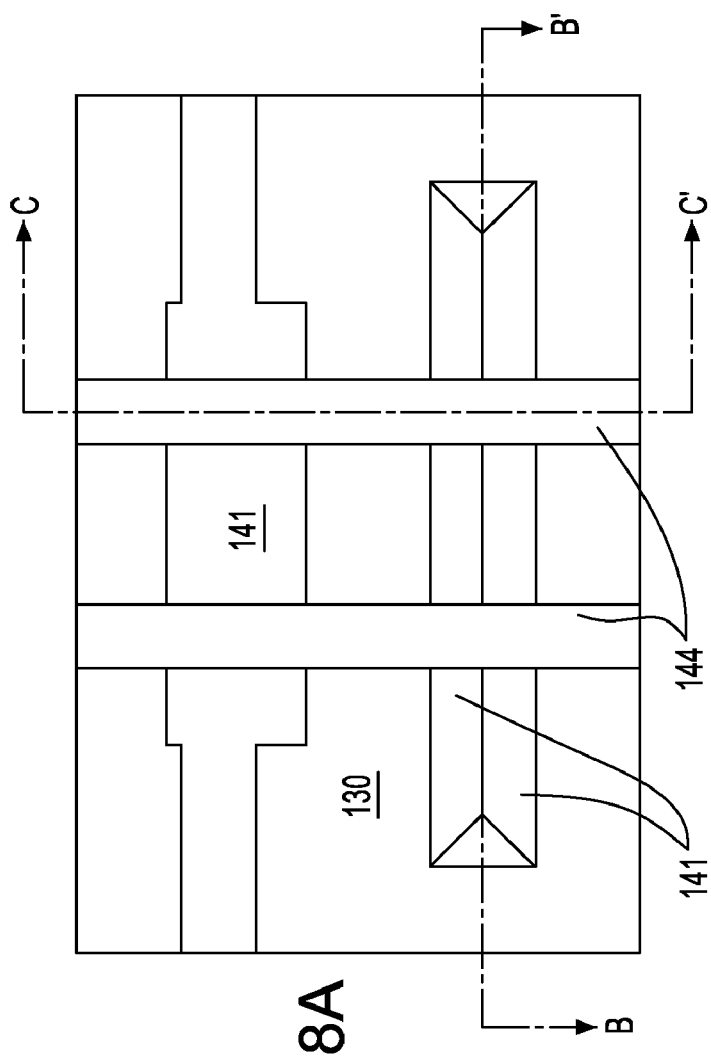
FIG. 8A
FIG. 8B
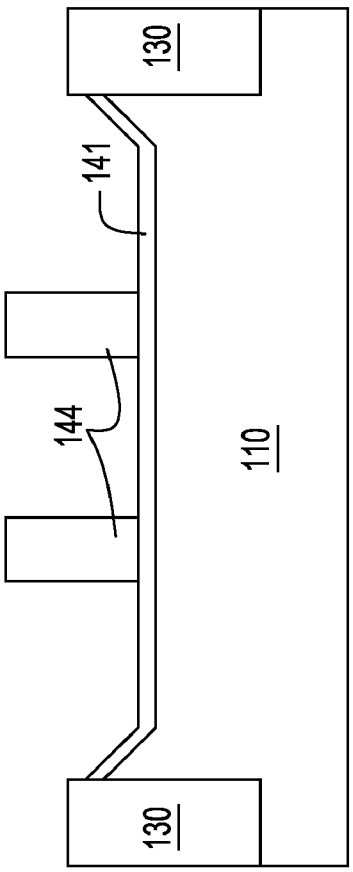

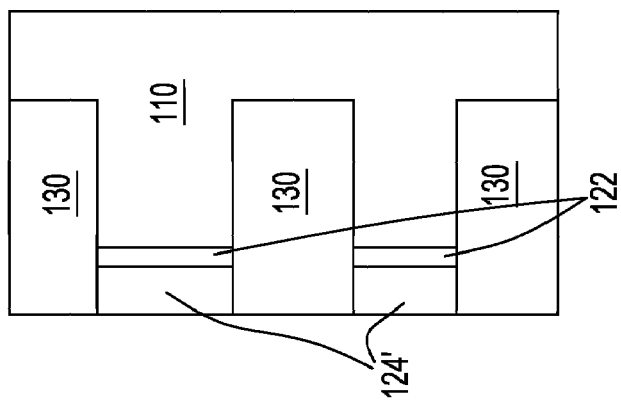
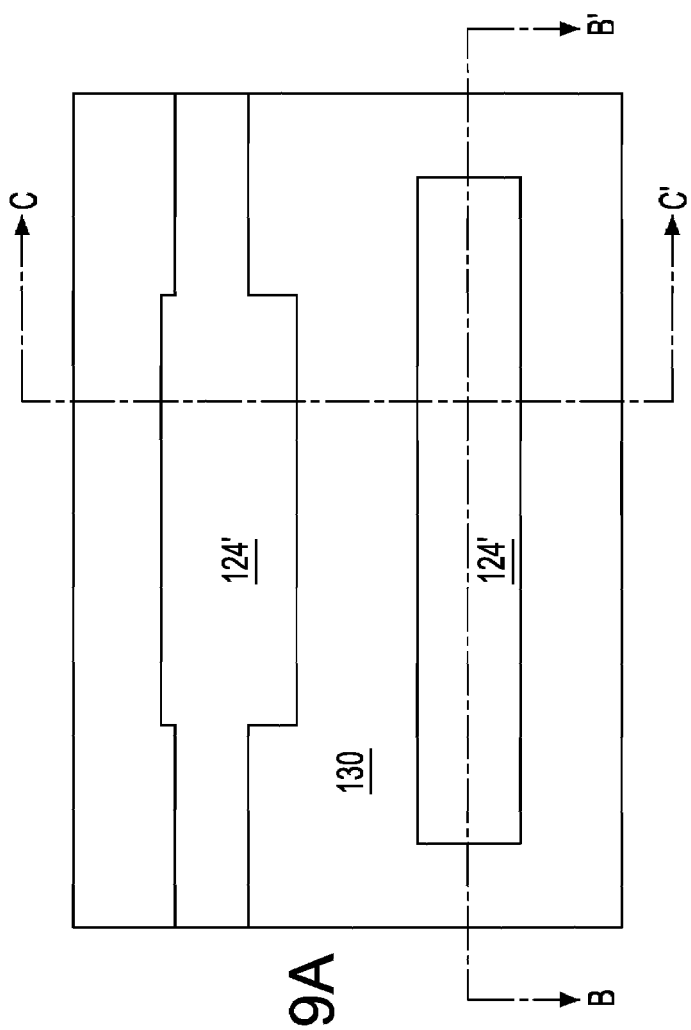
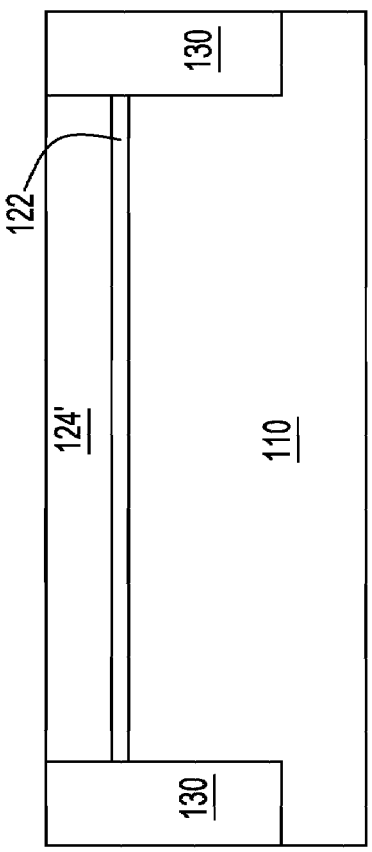
FIG. 9C
FIG. 9A
FIG. 9B

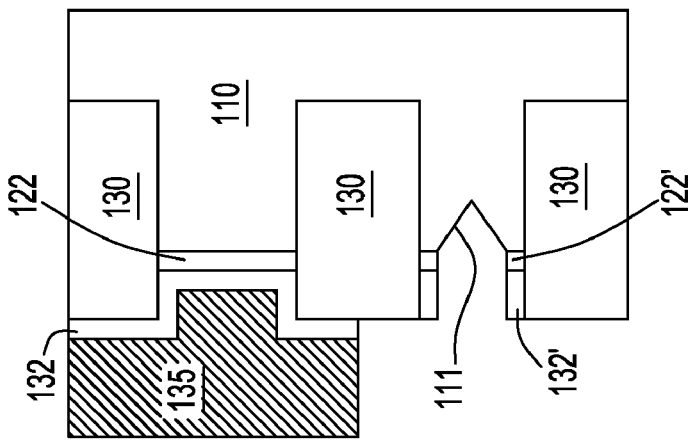
FIG. 11C
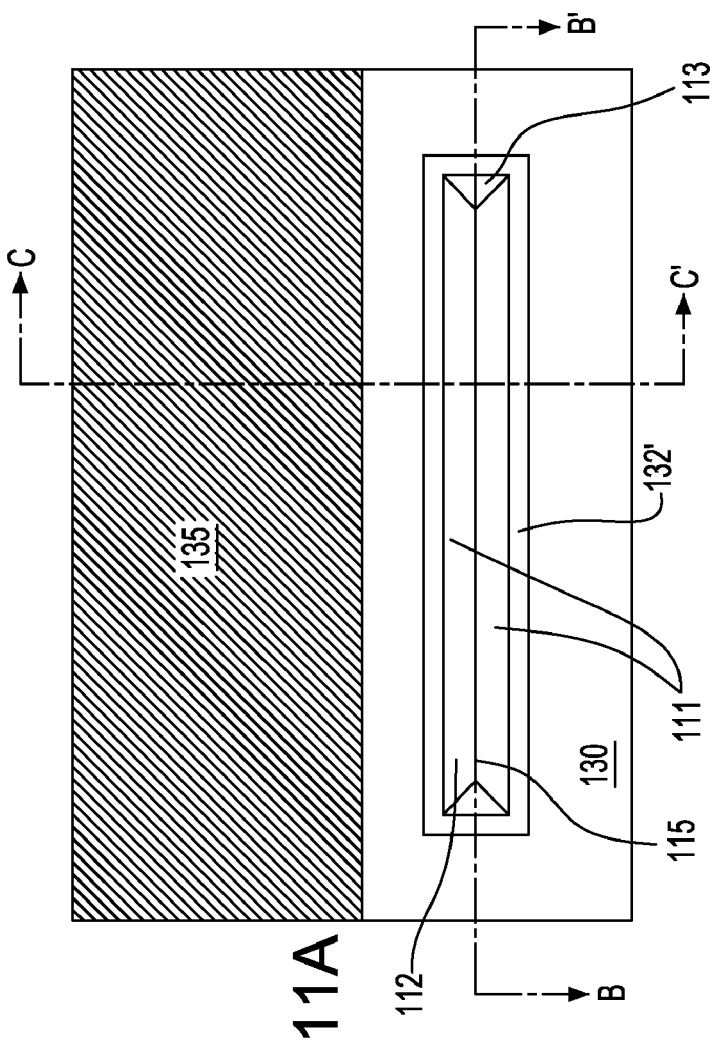
FIG. 11A
FIG. 11B

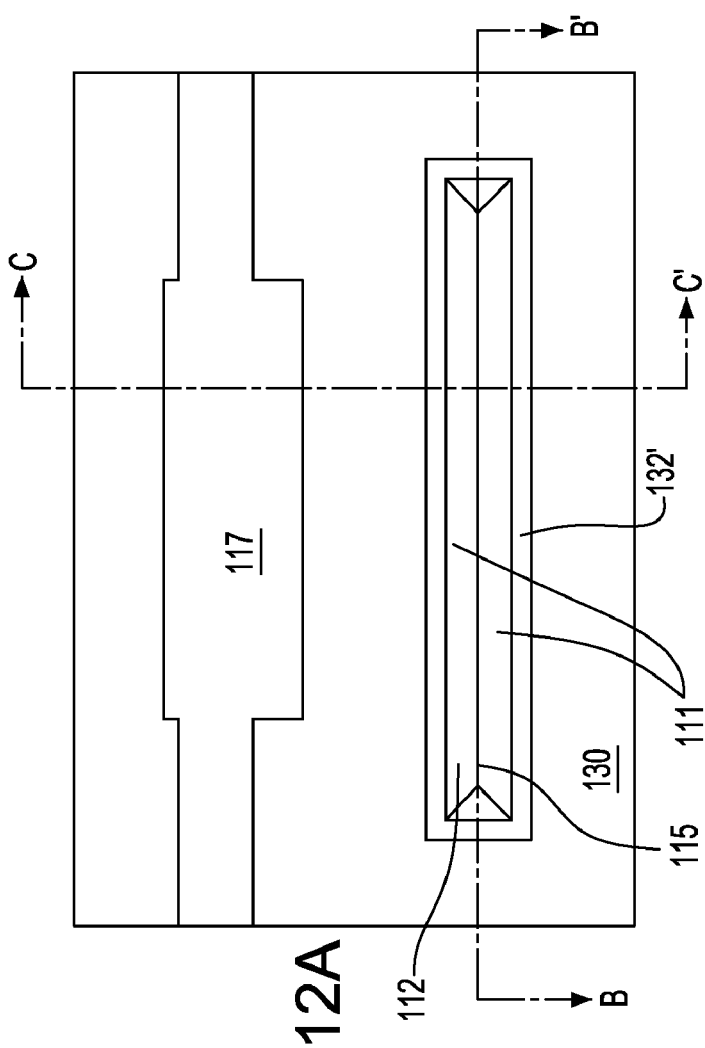
FIG. 12A
FIG. 12B
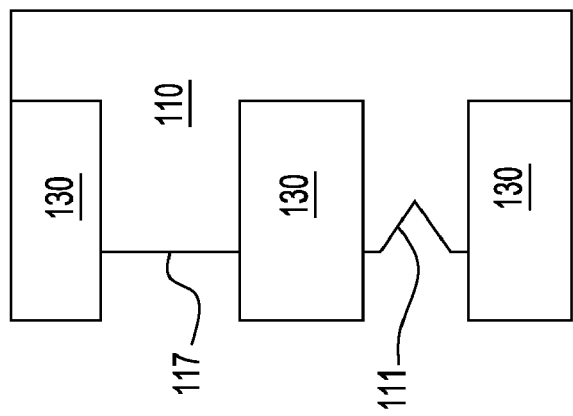
FIG. 12C

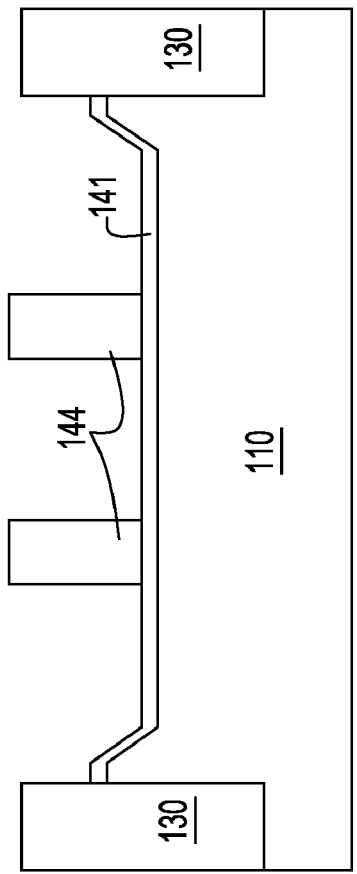
FIG. 13C
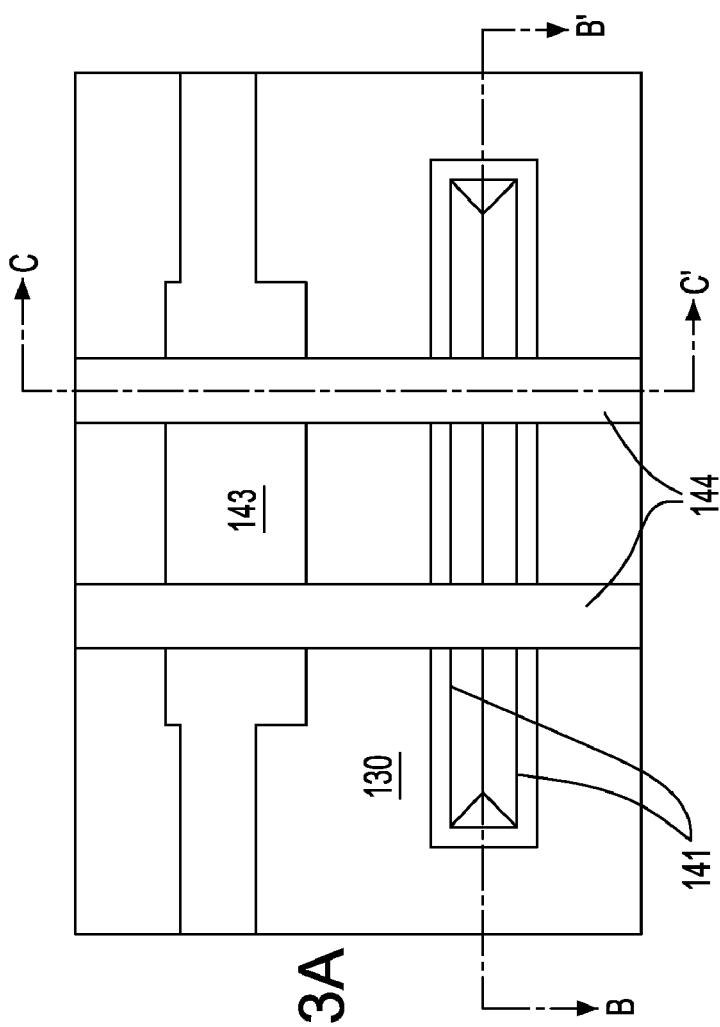
FIG. 13A
FIG. 13B

ENHANCED MOBILITY CMOS TRANSISTORS WITH A V-SHAPED CHANNEL WITH SELF-ALIGNMENT TO SHALLOW TRENCH ISOLATION

FIELD OF THE INVENTION

The present invention relates to semiconductor devices, and particularly, to complementary metal oxide semiconductor (CMOS) transistors.

BACKGROUND OF THE INVENTION

A key metric for performance of transistors is the on-current, which is the current of a transistor per unit gate width when it is turned on. The minority carrier mobility has been identified as a limiting factor in determining the on-current of high performance transistors. One of the key parameters determining the mobility of minority carriers is the crystallographic surface orientation on which the channel of the transistor is formed. By manipulating the transistor structure such that a favorable surface orientation is used for each type of transistors, both P-type field effect transistors (PFETs) and N-type field effect transistors (NFETs) with high minority carrier mobility may be formed in a CMOS transistor circuit.

In some semiconductors, electron mobility and hole mobility achieve maximum on different crystallographic planes. For example, electron mobility achieves the maximum in the {100} surface orientations and the minimum in the {110} surface orientations within single crystal silicon. In contrast, hole mobility achieves the maximum in the {110} surface orientations and the minimum in the {100} surface orientations within single crystal silicon.

The prior art has shown that the performance of a semiconductor circuit can be enhanced by utilizing different crystallographic planes for the PFET and NFET devices. The use of two different surface orientations on the same semiconductor substrate is called "hybrid orientation technology (HOT)" in the semiconductor industry. The prior art also provides methods of implementation of the hybrid orientation technology.

According to an approach in hybrid orientation technology, two different crystallographic planes are provided by bonding two or more wafers. In some cases, epitaxy in conjunction with chemical mechanical planarization (CMP) is employed to create areas with different surface orientations. The topography of surfaces after the bonding, epitaxy, and CMP tend to be planar. However, disadvantages of this approach include the complexity of the processes and the propensity of epitaxy for defect generation. Furthermore, a substantial portion of the surface area around the boundary between two different crystallographic orientations becomes unusable for high performance CMOS devices due to crystalline defects at the boundary of the single crystal area. This limits the flexibility in the layout of the CMOS circuitry since PFETs and FETs need to be placed within close proximity of each other for many high performance circuit designs.

A different approach utilizing facets with different crystallographic orientations than the original surface of a semiconductor substrate is known in the prior art. As an example, Weber et al., "A Novel Locally Engineered (111) V-channel pMOSFET Architecture with Improved Drivability Characteristics for Low-Standby power (LSTP) CMOS Applications," 2005 Symposium on VLSI, 2005, pp. 156-157, discloses a transistor structure in which a channel is formed within a V-shaped groove. The current flows within the plane of the V-shape groove following the path in the shape of the letter, V, including an inflection in the direction of the current in the middle of the channel.

Also, methods of forming a V-shaped groove with different crystallographic orientations than that of the original substrate by patterning a rectangular area of the semiconductor surface for exposure to a wet etch is also known. However, the methods of forming such V-shaped grooves according to the prior art involves lithographic patterning of the semiconductor area to be exposed to an etch. In other words, a lithographic mask must contain the patterns corresponding to the outer edges of the V-shaped grooves. Since lithographic processes require a certain level of overlay tolerance, the silicon area within which a V-shaped groove is to be formed must be larger than the size of the V-shaped groove. Thus, the silicon area needs to include an "overlay budget," or an extra space of silicon area to allow for the variations in the overlay during a lithographic process. However, each generation of semiconductor technology requires more compact transistor designs that use less of the silicon area for a transistor.

Therefore, there exists a need for a structure and methods for a more compact transistor with a V-shaped groove containing crystallographic facets formed on a semiconductor substrate.

Furthermore, there exists a need for a CMOS transistor structure and methods of forming a compact transistor with a V-shaped groove containing crystallographic facets formed on a semiconductor substrate along with another transistor with a channel formed on a semiconductor surface with the substrate orientation.

SUMMARY OF THE INVENTION

The present invention addresses the needs described above and provides structures and methods for an enhanced performance CMOS transistor with a V-shaped channel without the requirement for any extra semiconductor area for overlay tolerance.

Specifically, the present invention provides a CMOS transistor with a V-shaped groove that is self-aligned to surrounding shallow trench isolation (STI).

Also, the present invention provides a CMOS transistor with a frame of a flat semiconductor surface around a V-shaped groove.

The present invention enables the increase of transistor on-current by the inverse of the cosine of the angle between the crystallographic facets and the substrate orientation.

The present invention also enables the increase of the transistor on-current by utilizing the different surface orientations of crystallographic facets of the V-shaped grooves relative to the original substrate orientation.

The present invention is described with figures for a specific SRAM cell structure that utilizes two PFETs and four NFETs. This is because the set of challenges facing the enhancement of SRAM performance is a comprehensive example of the challenges facing the overall improvement of a large semiconductor circuit in general. For example, the transistors in an SRAM cell need to be high performance devices despite their small size, therefore requiring high mobility of the minority carriers in the channel. At the same time, the transistors require small off current, or small leakage current, which in turn requires a low level of defect density in the semiconductor substrate, especially in the channel. Also, due to the need to place PFETs and NFETs within a close proximity of one another, unusable area due to the defects generated from the boundary between areas of different crystallographic orientation needs to be minimized or better yet, eliminated. Also, SRAM devices are very common in semiconductor industry and many CMOS processes are developed around optimizing the SRAM performance.

Despite the fact that the main body of this disclosure is described using a specific SRAM layout, however, it should be recognized by those skilled in the art that the PFET area and NFET area in the description can be applied to any PFET or any NFET on the substrate. Thus, the present invention applies to any CMOS device that may utilize the benefits of having multiple surface orientations for other types of semiconductor devices.

While this disclosure uses a bulk silicon substrate to describe the invention, it should be recognized that the present invention can equally well be practiced on a silicon-on-insulator (SOI) substrate, a silicon substrate with a relaxed deposited thick layer of material such as a $Si_{1-x}Ge_x$ layer, a $Si_{1-x}C_x$ layer, or a $Si_{1-x-y}Ge_x C_y$ layer on the top of the substrate. Furthermore, the present invention is also compatible with a Si:C substrate. Such a substrate is typically obtained by substitutionally replacing about 0.5% to 4% of the silicon atoms with carbon atoms in a silicon substrate. This type of material is typically deposited by epitaxy and consequently, epitaxially aligned to the underlying substrate, that is, it forms part of the same crystalline structure. The materials that can be epitaxially grown on the underlying substrate include intrinsic silicon, intrinsic silicon germanium alloy, intrinsic silicon carbon alloy, intrinsic silicon germanium carbon alloy, P-doped silicon, P-doped silicon germanium alloy, P-doped silicon carbon alloy, P-doped silicon germanium carbon alloy, N-doped silicon, N-doped silicon germanium alloy, N-doped silicon carbon alloy, and N-doped silicon germanium carbon alloy. Also, given suitable chemicals to effect a preferential etch, or an anisotropic etch, as will be described below, the present invention may also be utilized on a III-V compound semiconductor substrate as well as a II-VI compound semiconductor substrate.

Dependence of etch rate on crystallographic orientations has been known in the art. Wet etch or reactive ion etch may be employed to create crystallographic facets that have different surface orientations than provided by the original surface orientation of the semiconductor substrate. In addition, selection of the preferred orientation of semiconductor surfaces through the use of surfactants is also known in the art.

The formation of V-shaped grooves known in the prior art requires lithographic patterning of the semiconductor area to be exposed to an etchant. The mask itself contains the patterns for the semiconductor area to be exposed to an anisotropic etch. Due to the overlay requirement during lithography, the semiconductor area needs to be larger than the area for the V-shaped groove by the overlay tolerance on all sides of the edge of the V-shaped groove. Areas of the substrate wherein the original surface orientation is preferred for the devices to be built are covered with the mask, which protects the semiconductor substrate from the etchant during the anisotropic etch process. The rest of the semiconductor surface is exposed to the etchant during the anisotropic etch process. An anisotropic etch process has different etch rates for different crystallographic orientations of the exposed surface and produces facets with the least etch rate for the given anisotropic etch process from the exposed silicon surface. An important feature of the prior art is that the pattern for the semiconductor area to be exposed to an etchant must be formed within the mask.

A critical feature of the present invention is self-alignment of the V-shaped channel to the shallow trench isolation. As stated above, the prior art requires a mask containing the shape of the semiconductor area to be exposed to the anisotropic etch. The present invention does not require the mask to contain the shapes of the semiconductor area to be exposed to the anisotropic etch. The present invention only requires a general area to be defined in the mask such that the general area contains the semiconductor area to be exposed to an etchant. The edge of the general area may be located anywhere within the shallow trench isolation that divides an area to be exposed to the etchant and another area to be protected from the etchant. Given the above limitation on the mask, the V-shaped trenches are formed self-aligned to the shallow trench isolation within the semiconductor area that is exposed to the etchant.

The pattern for a V-shaped groove for a high performance transistor requires small dimensions typically on the order of less than 100 nm, necessitating the use of a deep ultraviolet (DUV) mask according to the prior art. The present invention does not necessitate patterns for V-shape grooves in the mask, but requires blocking of the general area to be protected from an etchant. For practical purposes, even a mid-ultraviolet (MUV) mask suffices for such purposes since the edge of such a mask may land anywhere within an STI area that is located between the area to be exposed to an etchant and the rest of the area that is to be covered with a mask.

According to the present invention, the current flows along the pair of parallel edges and perpendicular to the cross-section that contains the V-shaped profile of the surfaces and of the channel. Typically, the physical channel is formed of two facets and a ridge in the middle. The cross-section of the channel perpendicular to the direction of the current has a V-shaped profile.

According to a first embodiment of the present invention, a V-shaped groove is formed in a semiconductor area that is bounded by shallow trench isolation (STI). The size of the V-shaped groove is identical to the size of the V-shaped groove. The interface between the facets of the V-shaped groove and surrounding STI is the "boundary" for the V-shaped groove.

Prior to exposing a portion of semiconductor substrate to an etchant for the formation of the V-shaped groove, the vertical height of the semiconductor surface is not substantially higher and preferably lower than the surface of the shallow trench isolation. This is to minimize the number of spurious facets during the formation of a V-shaped groove. A semiconductor surface located higher than the STI necessitates a longer anisotropic etch and may result in a deeper depth of the V-shaped groove.

A mask is used to cover the general area of the semiconductor surface to be protected from an anisotropic etch process. The exposed area of the semiconductor substrate is subjected to an anisotropic etch process. At least one V-shaped groove is formed within an area bounded by the shallow trench isolation. The number of V-shaped grooves depends on the geometry of the semiconductor area, or the active area that is surrounded by STI. While the present invention is described in detail for a rectangular semiconductor area herein, the present invention may be practiced with any geometry of semiconductor area that is conducive to the formation of V-shaped grooves. In some applications, multiple V-shaped grooves may be joined within a semiconductor area. Also, multiple CMOS transistors may be built on the same V-shaped groove.

Within a rectangular semiconductor area, a V-shaped groove consists of two triangular facets and two trapezoidal facets. The two trapezoidal facets are joined by a ridge between them. The surface orientations of the crystallographic facets within the V-shaped groove are at an angle to the surface orientation and are not orthogonal to the surface orientation. Preferably, the two trapezoidal crystallographic facets have a higher minority carrier mobility for the type of transistor to be built on and beneath them.

According to the first embodiment of the present invention, a transistor is formed utilizing the V-shaped groove. By depositing a gate stack including a gate dielectric and by patterning the gate stack such that a gate line crosses the ridge while exposing the V-shaped groove on both sides of the gate line, a channel is formed in the middle of the V-shaped groove with a source and drain on opposing sides of the gate line in a top-down view. Spacers may be placed around the gate line as needed. Finally, the contacts are formed on the source and the drain of the transistor.

The final structure of a transistor formed according to the first embodiment of the present invention has a channel that is located beneath the V-shaped groove and adjoins a portion of the ridge and a portion of each of the two crystallographic facets. In other words, a channel is formed such that the channel area encompasses at least a portion of the ridge and portions of each of the two crystallographic facets that form the ridge. Preferably, the channel area extends to the boundary and adjoins the shallow trench isolation on both crystallographic facets.

The source is adjoined to the channel and located on the ridge, that is, the source includes a portion of the ridge located on an extension of the portion of the ridge inside the channel area. A drain is adjoined to the channel on the other side of the gate line so that the drain does not adjoin the source. The drain is adjoined to the channel and located on the same ridge as the source. A gate dielectric adjoined to and located above the channel and a gate conductor is disposed on and adjoined to the gate dielectric. The gate conductor is not adjoined to the channel, the source or the drain. Preferably, the spacers separate the source and the drain from the gate conductor.

Cases are contemplated wherein the original ridge of the V-shaped groove is further recessed in the source or in the drain so that the vertical height of the extension of the portion of the ridge inside the channel area is lower than the vertical height of the ridge in the channel. Also, cases are contemplated wherein selective epitaxial deposition of semiconducting material raises the vertical height of the ridge of the V-shaped groove in the source or in the drain so that the extension of the portion of the ridge inside the channel area is higher than the vertical height of the ridge in the channel area.

The on-current of a transistor built on such facets benefits from the increase of the channel width by a factor of the inverse of the cosine of the angle between the surface orientation of the facet and the substrate orientation. Furthermore, the on-current of the same transistor benefits from the increased carrier mobility due to the new orientation of the surface beneath which the channel is formed.

The V-shaped groove according to the first embodiment of the present invention may be formed with a single ridge between two trapezoid facets, such as may be formed if the semiconductor area bounded by shallow trench isolation is rectangular. Alternatively, the V-shaped groove may be formed with multiple ridges, such as may be formed if the semiconductor area bounded by shallow trench isolation is "L" shaped or is shaped in a more complex pattern such as an "H" shape as long as the pattern of the semiconductor area bounded by the shallow trench isolation is conducive to the generation of a ridge joining two crystallographic facets near the middle of the two locally adjacent edges of the semiconductor area, or the two locally adjacent portions of the boundary.

Preferably, the formation of a transistor is on a ridge formed by two trapezoid facets. However, formation of a transistor on a ridge joined by a trapezoidal facet and a triangular edge is also contemplated herein.

According to a second embodiment of the present invention, a frame of semiconductor surface surrounds the V-shaped groove and is bounded by shallow trench isolation (STI). In other words, the V-shaped groove is nested within a frame of semiconductor surface. In turn, the frame of semiconductor surface is surrounded by shallow trench isolation. The frame of semiconductor surface has a constant width and is self-aligned to the shallow trench isolation. The frame may advantageously be used to reduce the corner rounding of the silicon surface and the indefiniteness of the surface orientations near the STI. According to the second embodiment of the present invention, the semiconductor area, or the active area, consists of the V-shaped groove and the frame of semiconductor surface. The interface between the facets of the V-shaped groove and the frame of the semiconductor surface is the "boundary" for the V-shaped groove.

Prior to exposing a portion of semiconductor substrate to an etchant for the formation of the V-shaped groove, the semiconductor surface to be etched is made lower than the STI in vertical height. This is achieved either by making the height of the STI higher or by recessing the semiconductor surface to be etched relative to STI prior to the exposure to the etchant. Once the semiconductor surface to be etched is lower than the surrounding STI, an STI spacer is formed inside the periphery of the semiconductor area, or the active area, by deposition of a blanket film followed by a reactive ion etch. The area covered by the STI spacer is the area for the frame of semiconductor surface that surrounds the V-shaped groove in the final structure.

Thereafter, a mask is used to cover the general area of the semiconductor surface to be protected from the etch and uncovered areas of the semiconductor substrate are subjected to an etch having an anisotropic etch rate. The STI spacer protects the semiconductor surface within the frame from being etched during the exposure to an etchant. A V-shaped groove is formed within an area bounded by the frame of semiconductor surfaces. The semiconductor surface within the frame has a surface orientation that is identical to the substrate orientation. The surface orientations of the crystallographic facets within the V-shaped groove are at an angle to the surface orientation and are not orthogonal to the surface orientation.

According to the second embodiment of the present invention, a transistor is formed utilizing the V-shaped groove. By depositing a gate stack including a gate dielectric and patterning the gate stack such that the gate line crosses the ridge while exposing the V-shaped groove on both sides of the gate line, a channel is formed in the middle of the V-shaped groove with a source and drain on opposing sides of the gate line in a top-down view. Spacers may be placed around the gate line as needed. Finally, the contacts are formed on the source and the drain of the transistor.

The final structure of a transistor formed according to the second embodiment of the present invention has a channel that is located beneath the V-shaped groove and adjoins a portion of the ridge and a portion of each of the two crystallographic facets. In other words, a channel is formed such that the channel area encompasses at least a portion of the ridge and portions of each of the two crystallographic facets that form the ridge. Preferably, the channel area extends into the frame of semiconductor surface and to the edges of the semiconductor area, or the active area, and adjoins the shallow trench isolation on both sides of the frame.

The spatial relationships among the channel, source, drain, a gate dielectric, gate conductor, and spacers are identical to those according to the first embodiment of the present invention.

According to the second embodiment of the present invention, the V-shaped groove may be formed within a single rectangular area or in an area with a shape of a more complex pattern as in the first embodiment of the present invention.

BRIEF DESCRIPTION OF THE DRAWINGS

FIGS. 3A-8A are top-down views of an SRAM structure according to the first embodiment of the present invention.

FIGS. 3B-8B are cross-sectional views of the SRAM structure along the line B-B' according to the first embodiment of the present invention.

FIGS. 3C-8C are cross-sectional views of the SRAM structure along the line C-C' according to the first embodiment of the present invention.

FIGS. 9A-13A are top-down views of an SRAM structure according to the second embodiment of the present invention.

FIGS. 9B-13B are cross-sectional views of the SRAM structure along the line B-B' according to the second embodiment of the present invention.

FIGS. 9C-13C are cross-sectional views of the SRAM structure along the line C-C' according to the second embodiment of the present invention.

DETAILED DESCRIPTION OF THE INVENTION

Figure 1:
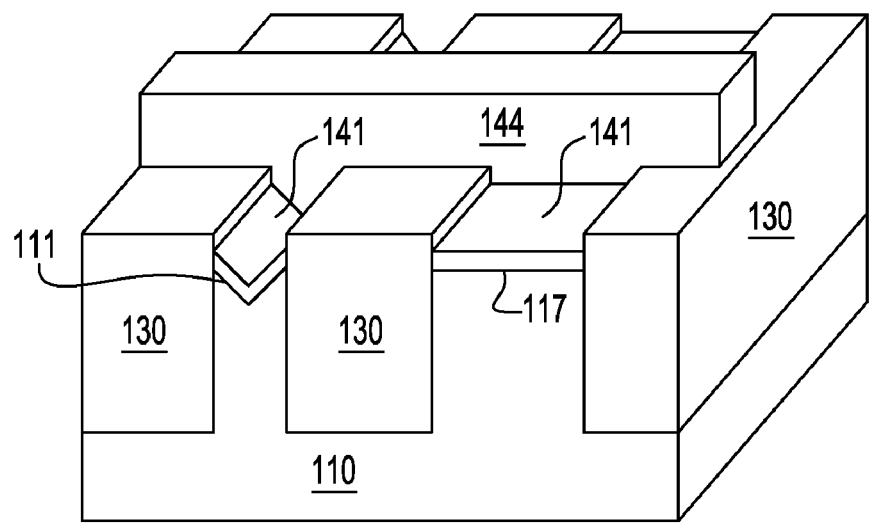
FIG. 1A is a bird's eye view of a portion of an SRAM structure according to the first embodiment of the present invention.

The present invention, which provides enhanced mobility CMOS transistors with a V-shaped channel having self-alignment to STI, will now be described in greater detail by referring to the drawings that accompany the present invention. It is noted that the drawings are provided for illustrative purposes and as such they are not drawn to scale.

FIG. 1 shows a bird's eye view of a portion of an exemplary SRAM structure after a gate stack etch and before removal of the gate dielectric according to the first embodiment of the present invention. In FIG. 1, a semiconductor substrate 110, shallow trench isolation 130, a gate dielectric 141, a V-shaped groove 111 formed in a PFET region, a flat semiconductor area 117 formed in an NFET region, and a gate line 144 are shown. The purpose of this bird's eye view is to show the general structure of the present invention that comprises a V-shaped groove formed by two crystallographic facets meeting at or around the middle of the semiconductor area and a channel formed adjacent to and beneath the V-shaped groove such that the direction of the current flow is in the direction of the ridge formed by the two adjoining crystallographic facets.

Before describing the present invention in further detail, definitions of terms used in this disclosure are presented herein.

The term "substrate orientation" denotes the orientation of the surface of the substrate in the case of a bulk semiconductor substrate consisting of only one single crystal across the entirety of the substrate. In the case of a silicon-on-insulator (SOI) wafer containing at least one buried oxide layer and in which all the semiconductor material between the top surface, on which semiconductor devices are built, and the first underlying buried oxide (BOX) layer has the same crystallographic orientations, the term "substrate orientation" denotes the orientation of the surface of the semiconductor material between the top surface and the first underlying BOX. In the case of an SOI wafer with multiple regions of semiconductor material with different crystallographic orientations among them, as is the case with substrates manufactured with hybrid orientation technology, the term "substrate orientation" denotes the local orientation of the semiconductor material, out of which or above which a referenced semiconductor device is located. In practical terms, "substrate orientation" refers to the original orientation of the semiconductor surface, above and/or out of which the referenced semiconductor device is manufactured.

Figure 2A:
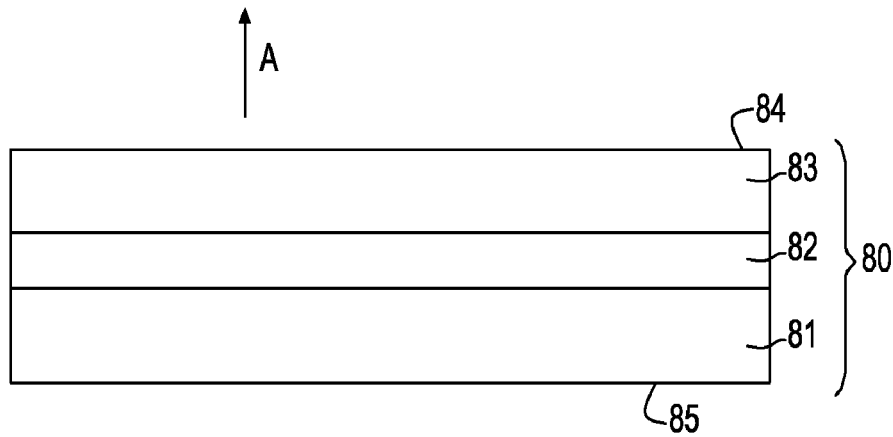
FIG. 2A is a cross-sectional view of a substrate having a substrate orientation in the direction of the arrow A.

The definition of "substrate orientation" is pictorially illustrated in FIG. 2A. An SOI substrate 80 comprises the bottom semiconductor portion 81, a buried oxide layer 82, a top semiconductor portion 83, and a top surface 84, and a bottom surface 85. The top surface 84 is substantially flat and extends parallel to the bottom surface 85. The top semiconductor portion 83 contains the semiconductor material on which semiconductor devices are to be subsequently built. An arrow labeled "A" is placed in FIG. 2A perpendicular to the top surface 84. The crystallographic orientation of the top semiconductor portion in the direction of the arrow A is the "substrate orientation." The crystallographic orientation of the bottom semiconductor portion 81 does not matter for the determination of the "substrate orientation" for the purposes of the present invention. If a wafer has multiple areas with multiple crystallographic orientations, the "substrate orientation" is defined locally utilizing the crystallographic orientation of the local top semiconductor portion in the direction of the arrow A.

In contrast to the substrate orientation, the surface orientation is defined locally from any substantially extending surface of semiconductor surface. The crystallographic orientation of the local semiconductor material in the direction of the vector normal to the local surface of that local semiconductor material defines the "surface orientation" of the local surface.

Figure 2B:
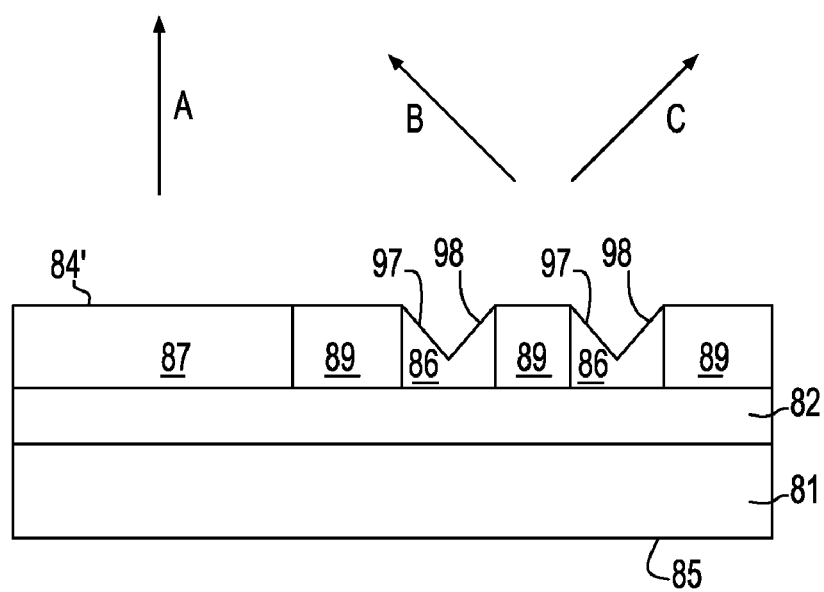
FIG. 2B is a cross-sectional view of a substrate having new surface orientations B and C according to the present invention.

FIG. 2B illustrates a structure with multiple surface orientations according to the present invention. The area of the top semiconductor portion 83 in FIG. 2A is divided into two portions after processing. A first portion 85 of top semiconductor with a first surface 84' has a surface orientation corresponding to the crystallographic orientation of the first portion in the direction of the arrow A. A second portion 86 of a top semiconductor with multiple second surfaces 97 and multiple third surfaces 98 has two surface orientations corresponding to the crystallographic orientations of the second portion in the direction of the arrows B and C. Obviously, both the first portion and second portion have the same crystallographic orientations in the same direction because the crystalline structure did not rotate during processing. Therefore, the direction of the arrow A is the direction of the substrate orientation, while the direction of the arrow B or C is at an angle with the substrate orientation.

It is noteworthy that standard semiconductor processing sometimes produces a surface orientation for the semiconductor material that is not quite the same as the original surface orientation due to imperfect processing conditions. The angle between this type of surfaces and the original surface orientation of the substrate, i.e., the substrate orientation, may be different from zero degree but is very close to zero degree, that is, less than 8 degrees and most likely to be less than 1 degree. The variations in this type of angle are subjected to process variations and are hard to predict or control, and does not coincide with any major crystallographic orientations, and most of all, does not serve useful purposes. This type of angle is herein referred to be "substantially zero degree" and refers to an angle generated by imperfections in processing rather than by design. In contrast, the type of angles outside the range of "substantially zero degree" is referred to be "substantially greater than zero degree"

Similarly, standard semiconductor processing also produces surface orientations for the semiconductor material that is vertical or almost vertical. The angle between this type of surfaces and the original surface orientation of the substrate, i.e., the substrate orientation, is either 90 degrees or very close to 90 degrees, that is, between 82 degrees and 98 degrees and most likely between 88 degrees and 92 degrees. Once again, the variations in this type of angle are subjected to process variations and are hard to predict or control, does not coincide with any major crystallographic orientations, and most of all, does not serve any useful purpose. This type of angle is herein referred to be "substantially orthogonal" and refers to an angle generated by imperfections in processing rather than by design. In contrast, an angle outside the range of "substantially orthogonal" is referred to be "substantially not orthogonal."

The type of surface orientation that the present invention enables is at an angle substantially greater than zero degree and substantially not orthogonal to the substrate orientations. For example, if the substrate orientation is (100) and the surface orientations after an anisotropic etch are {110} type planes, the angle between the substrate orientation and any of the surface orientation is 45 degrees. In general, the angle between two vectors in a cubic lattice can easily be calculated by the dot product of two vectors since the dot product is the length of the first vector times the length of the second vector times the cosine of the angle between the two vectors. The following tabulates angles between major crystallographic planes. Zero degree and 90 degree angles that are not intended to be obtained by the present invention are marked with N/A in table 1.

rectangular area that contains the original pad nitride 124 is the PFET area. The other area that also contains the pad nitride is the NFET area.

The STI regions are filled with STI materials 130, which are typically a silicon oxide with a liner. The liner is typically a nitride layer, an oxynitride layer, or a stack of silicon oxide and silicon nitride layers. For the description of the present invention, all materials filling the STI region are collectively called STI material 130. The structure that the STI material 130 fills is STI. The substrate is planarized with chemical mechanical polishing (CMP) after the STI regions are filled with STI material 130 so that the residual pad nitride 124' is only a portion of the original pad nitride 124 remains on top of the pad oxide 122. FIGS. 4A-4C show the structure of the exemplary SRAM structure according to the first embodiment of the present invention after CMP.

The residual pad nitride 124' is removed after CMP preferably by a wet etch. At this point, the pad oxide 122 covers both the PFET area and the NFET area. The STI regions are filled with STI material 130. The height of the surface of the pad oxide 122 is at this point lower than the height of the STI by the thickness of the residual pad nitride 124' at the end of the CMP step. The resulting structure is shown in FIGS. 5A-5C.

Masking material 135 is deposited or applied on the surface of the semiconductor substrate and lithographically patterned. The masking material 135 may comprise a photoresist, a dielectric material, a stack of dielectric materials, a stack of dielectrics and a semiconductor material, or a stack of dielectric materials and a photoresist. Preferably, the masking material 135 is a photoresist.

The lithographic mask for this masking material 135 does not need to contain the patterns for the semiconductor area, specifically, the PFET area. Instead, the lithographic mask needs only to contain a pattern for the general area to be masked or exposed. For all practical purposes, a mid-ultra-

TABLE 1

Angles between substrate orientation and major crystallographic orientations according to the present invention

|  | Surface orientation {100} | Surface orientation {110} | Surface orientation {111} | Surface orientation {211} | Surface orientation {221} | Surface orientation {311} |
|---|---|---|---|---|---|---|
| Substrate orientation (100) | N/A | 45 degrees | ~54.73 degrees | ~35.26 or ~65.90 degrees | ~48.18 or ~70.53 degrees | ~25.24 or ~72.45 degrees |
| Substrate orientation (110) | 45 degrees | N/A | ~35.26 degrees | ~30.01, ~54.74 or ~73.22 degrees | ~19.47, 45 or ~76.36 degrees | ~31.48 or ~64.76 degrees |
| Substrate orientation (111) | ~54.73 degrees | ~35.26 degrees | N/A | ~19.47 or ~61.87 degrees | ~15.79, ~54.74 or ~78.90 degrees | ~29.49, ~58.52 or ~79.98 degrees |

Figure 3C:
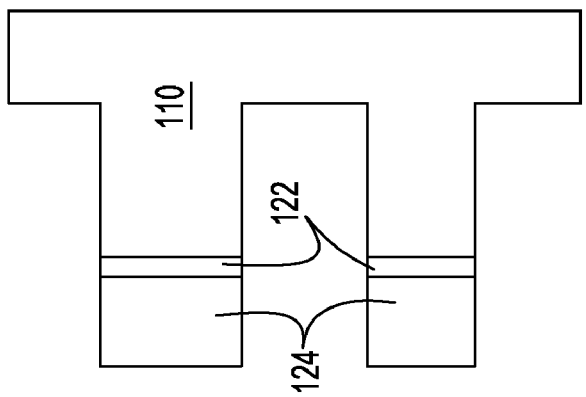
Figure 3A:
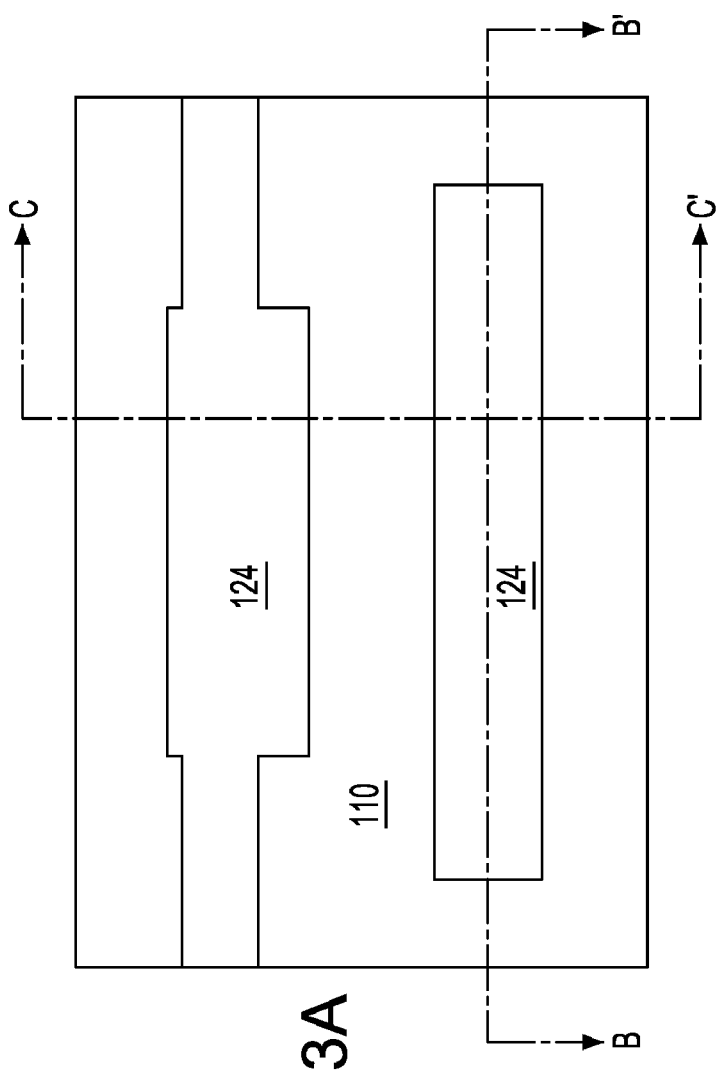
Figure 3B:
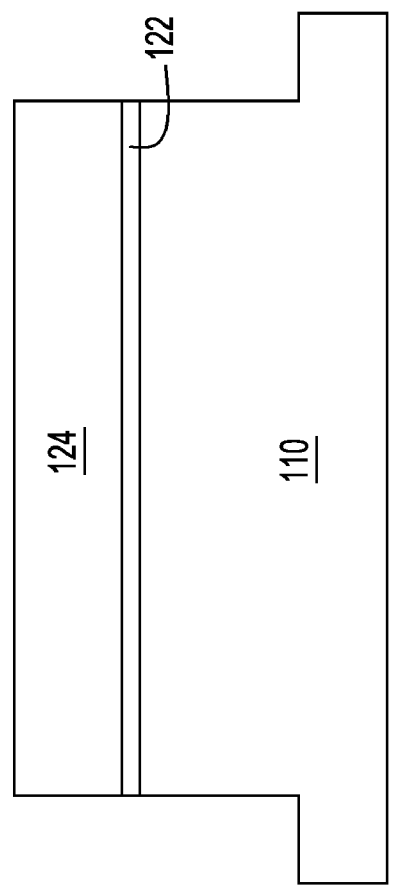

Proceeding with detailed description of the present invention, FIGS. 3A-3C show schematics of an exemplary SRAM according to the first embodiment of the present invention after the lithographic patterning of shallow trench isolation (STI) and an STI etch. A pad oxide layer 122 and an original pad nitride layer 124 are deposited on a semiconductor substrate 110 and are patterned to form STI regions. The semiconductor material in the STI region is then etched. In this exemplary SRAM structure, the areas in FIG. 3A that contain the original pad nitride 124 after the STI etch are semiconductor areas. Of the two semiconductor areas in FIG. 3A, the violet (MUV) mask is sufficient. This feature of the present invention is enabled because the formation of a V-shaped groove is self aligned to the STI 130. FIGS. 6A-6C demonstrates the simplicity of the process according to the first embodiment of the present invention. The masking material 135 blocks an area including the NFET area. However, the edge of the masking material 135 may be located anywhere within an STI region between a PFET area and an NFET area without adversely affecting the resulting structure. The PFET area is not covered by the masking material 135 at this point but is covered only by the pad oxide 122.

Figure 7C:
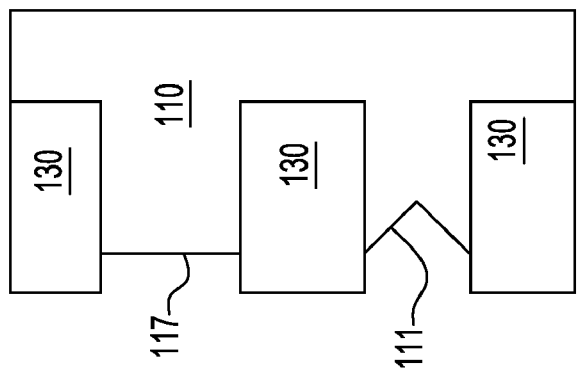
Figure 7A:
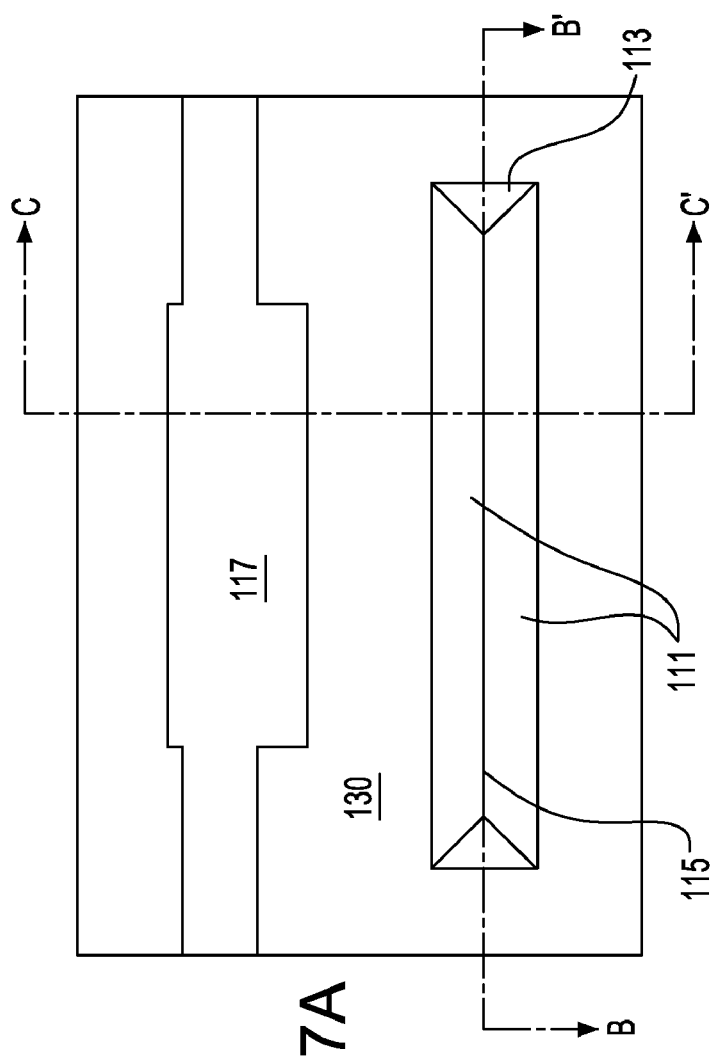
Figure 7B:
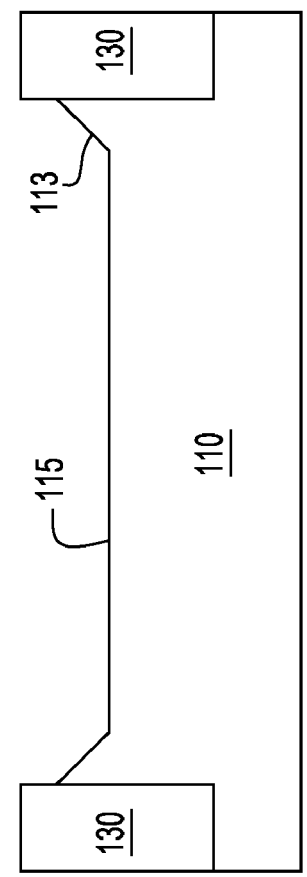

The pad oxide 122 is then removed from the PFET area and the top semiconductor surfaces of the exposed PFET area is subjected to an anisotropic etch, which produces surface orientations other than the substrate orientation of the semiconductor substrate. Thereafter, the masking material 135 is removed. The resulting structure is shown in FIGS. 7A-7C, which shows the flat semiconductor surface 117 with the same surface orientation as the substrate orientation, two trapezoid facets 111, the ridge 115 at which the two trapezoidal facets 111 meet, two triangle facets 113, as well as the STI 130 and the substrate 110.

Generally, the numbers of and the shapes of the facets depend on the particular geometry of a semiconductor area exposed to the anisotropic etch process. The present invention, including the first embodiment, requires only that two facets meet to form a ridge on the semiconductor surface below which a channel is to be formed. Formation of a channel adjacent to and beneath a ridge formed by two trapezoid facets is preferred. However, formation of a channel adjacent to and beneath a ridge formed by a trapezoid facet and a triangle facet is also contemplated.

While the present invention is described for a rectangular semiconducting area, one of ordinary skill in the art may join many rectangular semiconductor areas together to form a more complex overall shape such as an "L" shape or an "H" shape. Even multiple transistors may be formed on a long V-shaped groove or on a V-shaped groove with more complex overall shape. In this case, "trapezoidal" facets may not necessarily be a trapezoid but just have two parallel edges, one of which join another "trapezoidal" facets to form a ridge where the two facets meet near the middle of the two locally adjacent edges of the semiconductor area.

Also, one of ordinary skill in the art can form an arbitrary polygon shape that has non-orthogonal angles between the adjoining edges of the shape of the semiconductor area such that the resulting etched shape still contains a V-shaped groove formed by two adjoining crystallographic facets. For example, if a (111) substrate is used, the angle between adjoining edges of the semiconductor area can be 60 degrees or 120 degrees. A V-shaped groove with two crystallographic facets joined by a ridge between them can still be formed within a semiconductor area.

The application of an etchant during the anisotropic etch process may be done through a wet etch process or a reactive ion etch process. Both types of anisotropic etch processes need to have anisotropic etch rates along different crystallographic orientations of the substrate. A crystallographic facet along which the etch rate is low for the anisotropic etch rate process results at the end of the anisotropic etch. If a set of crystallographic facets have substantially lower etch rates compared to the rest of the crystallographic facets, the resulting structure from an exposed semiconductor area contains primarily the set of crystallographic facets with the low etch rate.

In the exemplary SRAM structure used for the description of the present invention, the substrate is a silicon substrate with a (100) orientation. Preferably, the PFET area is exposed to an anisotropic etch. The surface orientations of the crystallographic facets are preferably $\{110\}$, $\{111\}$, $\{211\}$, $\{221\}$ or $\{311\}$, and most preferably $\{110\}$. This is because a PFET has the highest mobility on a silicon surface with a $\{110\}$ surface orientation and NFET has the highest mobility on a silicon surface with a $\{100\}$ surface orientation.

In this case, the following exemplary wet etch processes may be used. A first example of such a process is a wet etch process utilizing a pure TMAH (tetramethyl-ammonium hydroxide; $(CH_3)_4NOH$) solution, which produces $\{110\}$ facets due to the higher rate of etch along $\{110\}$ surface orientations than along $\{100\}$ surface orientations. A second example is a wet etch process which comprises a pretreatment with SC1 clean consisting of a mixture of $H_2O$, $NH_4OH$, and $H_2O_2$, followed by an etch in a dilute hydrofluoric acid (DHF), then followed by another etch in an ammonium hydroxide solution ($NH_4OH$). This process also has higher etch rate along $\{110\}$ surface orientations than along $\{100\}$ surface orientations. A third example is a reactive ion etch used for deep trench formation in the DRAM processes, which tends to produce $\{110\}$ facets on the surface of the semiconductor material.

For the anisotropic etch process, other anisotropic wet etch or reactive ion etch processes may be used as long as etchant has an anisotropic etch rate along different crystallographic planes. In the case of an anisotropic wet etch process, the semiconductor substrate may be pretreated with a chemical that modifies the ratio of etch rates along different crystallographic planes of the semiconductor substrate prior to subjecting the exposed portion of the semiconductor surface to the etchant.

A suitable threshold voltage implantation may be employed at various stages of the etch to optimize the FET performance.

Thereafter, a gate dielectric 141 is formed on both the NFET area and the PFET area, followed by a deposition of gate conductor and patterning of the gate conductor to form gate lines 144. FIGS. 8A-8C show the exemplary SRAM structure at this stage. Spacers, source and drain extensions, and source and drain regions with suitable doping or embedded material are formed thereafter followed by contact formation and back-end-of-line processes for wiring of devices. Spacers are formed around the gate lines. The extensions are formed beneath the spacers within the semiconductor substrate. The source and drain regions are formed adjacent to the spacers and beneath the surface of the semiconductor substrate. Contacts are formed on the source and drain regions. One of ordinary skill in the art can easily optimize the placement of the spacers, extensions, source and drain regions, and contacts based on the location of the semiconductor area, that is, the PFET area and the NFET area, and the location of the gate lines.

According to the second embodiment of the present invention, identical processing steps are employed up to the lithographic patterning of shallow trench isolation (STI) and an STI etch as shown in FIGS. 3A-3C. Preferably, during the deposition of the pad nitride 124, however, a thicker pad nitride layer is deposited. The same STI fill process is used to fill the STI regions with STI material 130.

The substrate is planarized with chemical mechanical polishing (CMP) after the STI regions are filled with STI material 130. In a preferred version of the second embodiment of the present invention, however, the residual pad nitride 124' is thicker than that in the first embodiment so that after the planarization. The surface of the pad oxide 122 is at this point recessed by the thickness of the residual pad nitride 124' at the end of the CMP step as shown in FIGS. 9A-9C.

The residual pad nitride 124' is removed preferably by a wet etch. An STI spacer layer 132 is deposited by blanket deposition followed by a deposition or application of a masking material 135. The masking material 135 is then lithographically patterned. As pointed out before, the masking material 135 does not need to contain the patterns for the semiconductor area to be etched but needs to contain only the pattern for the general area to be masked or exposed. For all practical purposes, a mid-ultraviolet (MUV) mask is sufficient.

Figure 10C:
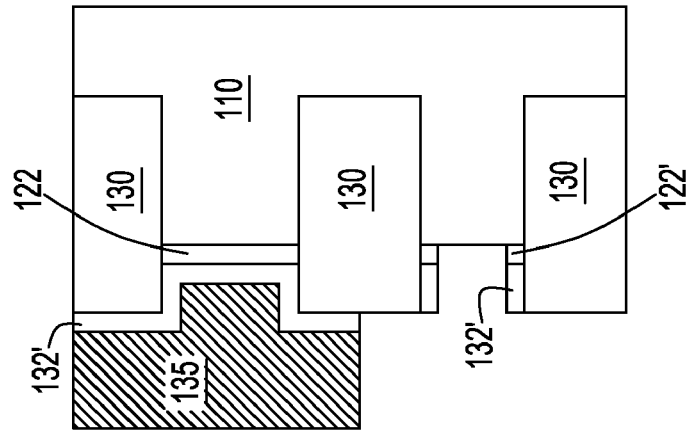
Figure 10A:
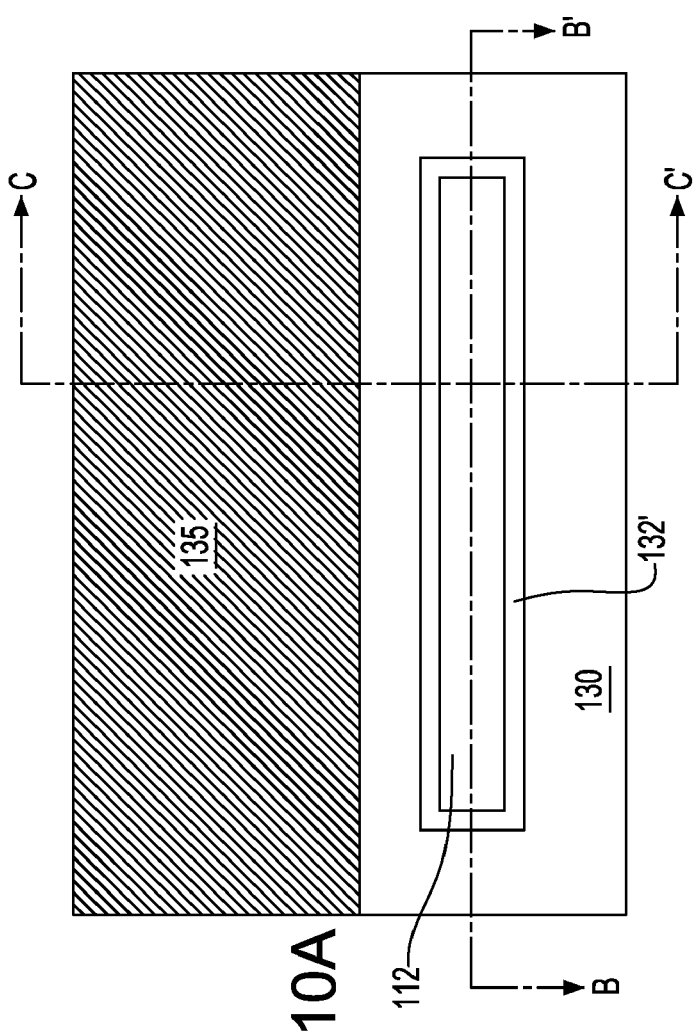
Figure 10B:
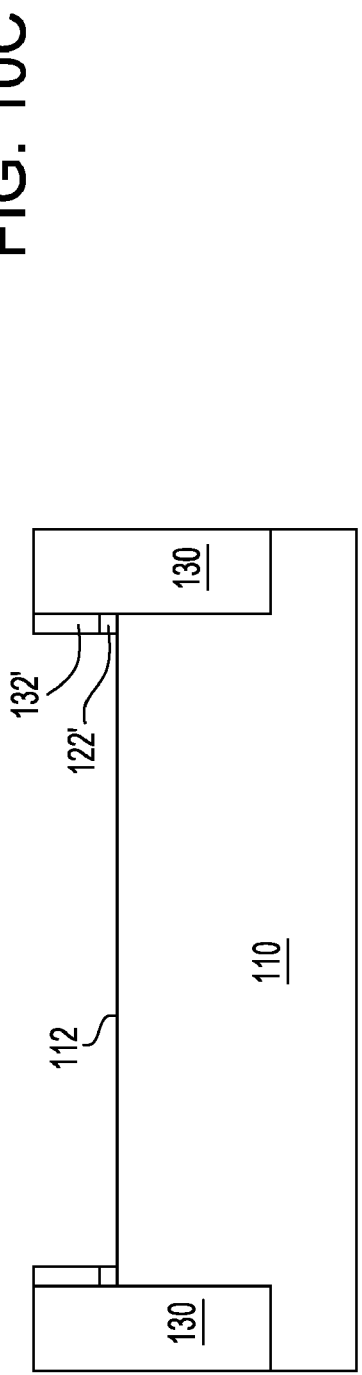

A reactive ion etch (RIE) is employed to form STI spacers 132' on the inside of and along the periphery of semiconductor areas not covered by the masking material 135. The resulting structure is shown in FIGS. 10A-10C, wherein a stack of an STI spacer 132' and a residual pad nitride 122' is formed along the inside of the edge of the PFET area.

Thereafter, the PFET area is subjected to an anisotropic etch. This produces surface orientations other than the substrate orientation of the semiconductor substrate. The stack of an STI spacer 132' and a residual pad nitride 122' protects the semiconductor surface located underneath such that the resulting structure forms a V-shaped groove only inside the stack of an STI spacer 132' over a residual pad nitride 122'. The surface of the V-shaped groove consists of facets with different crystallographic orientations than the substrate orientation of the semiconductor substrate. The resulting structure is shown in FIGS. 11A-11C.

The same examples and limitations apply to the anisotropic etch and the use of threshold voltage implantation in the second embodiment as in the first embodiment of the present invention.

The masking material 135 is removed. The STI spacer layer 132, the pad oxide layer 122, and the stack of an STI spacer 132' and a residual pad nitride 122' are then removed preferably by a wet etch. The newly exposed area forms a frame of a semiconductor surface with the same surface orientation as the substrate orientation. Preferably, the STI material 130 is recessed at this point to reduce the step height variations before the deposition of the gate stack. The resulting structure is shown in FIGS. 12A-12C, which shows the flat semiconductor surface 117 which has the same surface orientation as the substrate orientation, two trapezoid facets 111, the ridge 115 at which the two trapezoidal facets 111 meet, two triangle facets 113, and the frame 132' of semiconductor surface as well as the STI 130 and the substrate 110.

Thereafter, the process sequence follows in the same way as in the first embodiment of the present invention providing the structure shown in FIGS. 13A-13C. Also, the same considerations for the choice of crystallographic surfaces apply to the second embodiment as to the first embodiment.

One of ordinary skill in the art may construct an alternative structure and processing methods for a silicon substrate with a (110) orientation. In this case, the NFET area is preferably exposed to an anisotropic etch. The surface orientations of the crystallographic facets are preferably {100}, {111}, {211}, {221} or {311}, and most preferably {100}. This is because a NFET has the highest mobility on a silicon surface with a {100} surface orientation and PFET has the highest mobility on a silicon surface with a {110} surface orientation.

An example of an anisotropic etch process that produces {100} orientations is a wet etch process which comprises a pretreatment in a dilute hydrofluoric acid (DHF), followed by drying in an environment containing isopropyl alcohol (IPA) vapor, then followed by an etch in an ammonium hydroxide (NH$_4$OH) solution.

Also, one of ordinary skill in the art may construct an alternative structure and processing methods for a silicon substrate with a (111) orientation. The PFET area and the NFET area are alternately exposed to anisotropic etch chemistry to produce optimal crystallographic orientations for each type of transistors. The surface orientations of the crystallographic facets are preferably {100}, {110}, {211}, {221} or {311}. Most preferably, the surface orientations are {110} orientations for the PFET area and {100} orientations for the NFET area.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure, comprising:
   a semiconductor substrate including a single crystalline semiconductor material, said semiconductor substrate having a substrate orientation;
   a V-shaped groove with a ridge and a first crystallographic facet and a second crystallographic facet of said single crystalline semiconductor material, wherein said V-shaped groove is bounded by a shallow trench isolation structure and said first crystallographic facet and said second crystallographic facet are joined at said ridge;
   a channel located beneath said V-shaped groove, said channel located directly beneath a first portion of said ridge, a portion of said first crystallographic facet, and a portion of said second crystallographic facet;
   a source located directly beneath a second portion of said ridge, said source comprising a first portion of said single crystalline semiconductor material;
   a drain located directly beneath a third portion of said ridge, said drain and comprising a second portion of said single crystalline semiconductor material;
   a gate dielectric located on and above said channel; and
   a gate conductor located on said gate dielectric.

2. The semiconductor structure of claim 1, wherein said substrate orientation of said single crystalline semiconductor material is a (100) orientation and surface orientations of said first crystallographic facet and said second crystallographic facet are {110} orientations.

3. The semiconductor structure of claim 2, wherein said semiconductor structure is a p-channel metal oxide semiconductor field effect transistor (MOSFET).

4. The semiconductor structure of claim 1, wherein said substrate orientation of said single crystalline semiconductor material is a (110) orientation and surface orientations of said first crystallographic facet and said second crystallographic facet are {100} orientations.

5. The semiconductor structure of claim 4, wherein said semiconductor structure is an n-channel metal oxide semiconductor field effect transistor (MOSFET).

6. The semiconductor structure of claim 1, wherein said semiconductor substrate is a bulk silicon substrate.

7. The semiconductor structure of claim 1, wherein said semiconductor substrate is a silicon on insulator (SOI) substrate with at least one buried oxide (BOX) layer.

8. The semiconductor structure of claim 1, wherein said semiconductor substrate contains:
   an underlying single crystalline silicon substrate; and
   an epitaxially disposed material on said underlying single crystalline silicon substrate that is selected from the group consisting of:
   intrinsic silicon, intrinsic silicon germanium alloy, intrinsic silicon carbon alloy, intrinsic silicon germanium carbon alloy, P-doped silicon, P-doped silicon germanium alloy, P-doped silicon carbon alloy, P-doped silicon germanium carbon alloy, N-doped silicon, N-doped silicon germanium alloy, N-doped silicon carbon alloy, and N-doped silicon germanium carbon alloy.

9. The semiconductor structure of claim 1, wherein surface orientations of said first crystallographic facet and said second crystallographic facet are selected from the group consisting of {100} orientations, {110} orientations, {111} orientations, {211} orientations, {221} orientations, and {311} orientations.

10. The semiconductor structure of claim 1, wherein said first and second crystallographic facets contact sidewalls of said shallow trench isolation structure and are recessed below a top surface of said shallow trench isolation structure.

11. A semiconductor structure comprising first and second field effect transistors located on a semiconductor substrate that includes a single crystalline semiconductor material, said semiconductor substrate having a substrate orientation, wherein said first field effect transistor comprises:
- a V-shaped groove with a ridge and a first crystallographic facet and a second crystallographic facet of said single crystalline semiconductor material, wherein said V-shaped groove is bounded by a shallow trench isolation structure, and said first crystallographic facet and said second crystallographic facet are joined at said ridge;
- a first channel located beneath said V-shaped groove, said first channel is located directly beneath a portion of said ridge, a portion of said first crystallographic facet, and a portion of said second crystallographic facet;
- a first source located directly beneath a second portion of said ridge, said source comprising a first portion of said single crystalline semiconductor material; and
- a second drain located directly beneath a third portion of said ridge, said second drain comprising a second portion of said single crystalline semiconductor material, and wherein said second field effect transistor comprises:
- a top surface of said singe crystalline semiconductor material having a surface normal along said substrate orientation;
- a second channel located beneath a first portion of said surface having said surface orientation;
- a third source located directly beneath a second portion of said surface having said surface orientation; and
- a second drain located directly beneath a third portion of said surface having said surface orientation.

* * * * *